US012812874B2

(12) United States Patent
Cohen et al.

(10) Patent No.: US 12,812,874 B2
(45) Date of Patent: Nov. 24, 2026

(54) PHASE CHANGE MEMORY LAYER AND SEED LAYER WITH ALIGNED OUT-OF-PLANE CRYSTALLINE AXES

(71) Applicant: International Business Machines Corporation, Armonk, NY (US)

(72) Inventors: Guy M. Cohen, Ossining, NY (US); Cheng-Wei Cheng, White Plains, NY (US); Matthew Joseph BrightSky, Armonk, NY (US); Daniel Piatek, Garfield, NJ (US)

(73) Assignee: International Business Machines Corporation, Armonk, NY (US)

( * ) Notice: Subject to any disclaimer, the term of this patent is extended or adjusted under 35 U.S.C. 154(b) by 384 days.

(21) Appl. No.: 18/205,727

(22) Filed: Jun. 5, 2023

(65) Prior Publication Data

US 2024/0407178 A1 Dec. 5, 2024

(51) Int. Cl.
*H10B 63/10* (2023.01)
*H10B 63/00* (2023.01)
(Continued)

(52) U.S. Cl.
CPC ............ *H10B 63/10* (2023.02); *H10B 63/30* (2023.02); *H10N 70/021* (2023.02); (Continued)

(58) Field of Classification Search
CPC ...... H10B 63/10; H10B 63/30; H10N 70/021; H10N 70/231; H10N 70/841; H10N 70/8828; H10N 70/826
See application file for complete search history.

(56) References Cited

U.S. PATENT DOCUMENTS 7,638,786 B2 12/2009 Matsui
7,745,809 B1 * 6/2010 Sutardja ............ H10N 70/8413 257/734
(Continued)

FOREIGN PATENT DOCUMENTS

CN 115004302 9/2022
CN 121464733 A 2/2026
(Continued)

OTHER PUBLICATIONS

Guy Cohen. et al. Phase change memory cell with crystalline structure aligned to seed layer. PCM_structure with EPI_Apr. 26, 2023_v2_with_post_review_comments_May 12, 2023. p. 21.
(Continued)

*Primary Examiner* — Caleb E Henry
(74) *Attorney, Agent, or Firm* — Harrity & Harrity, LLP

(57) ABSTRACT

A phase-change memory cell includes an insulating layer; a first electrode embedded in the insulating layer, wherein an outer end of the first electrode is locally flush with an outer surface of the insulating layer; a second electrode, larger than the first electrode, and spaced from the first electrode; a compositionally homogenous crystalline phase change material layer; and a highly oriented seed layer. A crystal structure of the homogenous phase change material layer is correlated with a crystal structure of the highly oriented seed layer. The compositionally homogenous phase change material layer and the highly oriented seed layer are located at least partially between the first and second electrodes.

25 Claims, 10 Drawing Sheets

(51) Int. Cl.
*H10N 70/00* (2023.01)
*H10N 70/20* (2023.01)

(52) U.S. Cl.
CPC ......... *H10N 70/231* (2023.02); *H10N 70/841* (2023.02); *H10N 70/8828* (2023.02)

(56) References Cited

U.S. PATENT DOCUMENTS 8,017,929 B2 * 9/2011 Kang .................. H10N 70/231 438/102
8,030,130 B2 * 10/2011 Breitwisch ......... H10N 70/8825 438/103
8,049,197 B2 * 11/2011 Kau .................. H10N 70/8265 257/3
8,335,106 B2 12/2012 Aizawa
8,828,785 B2 9/2014 Cohen et al.
9,520,560 B2 12/2016 Hidaka
9,627,443 B2 4/2017 Jo
10,090,460 B2 10/2018 Saito
10,700,274 B2 6/2020 Cohen
2002/0058389 A1 * 5/2002 Wicker ............. H01L 21/76843 257/E27.081
2005/0024933 A1 * 2/2005 Pellizzer ............... H10B 63/32 365/163
2006/0166455 A1 * 7/2006 Gordon .............. G11C 13/0069 438/130
2008/0164452 A1 * 7/2008 Joseph ................. H10N 70/231 438/102
2008/0290335 A1 * 11/2008 Lin ...................... H10N 70/068 257/E47.001
2010/0163832 A1 * 7/2010 Kau .................. H10N 70/8265 438/102
2010/0165719 A1 * 7/2010 Pellizzer .............. G11C 13/004 365/210.1
2011/0037042 A1 * 2/2011 Breitwisch ............ H10B 63/30 257/E47.001
2011/0143169 A1 * 6/2011 Albrecht ................ B82Y 10/00 216/22
2011/0212568 A1 * 9/2011 Shin .................. H10N 70/8828 438/102
2012/0248398 A1 * 10/2012 Liu ...................... H10B 63/845 257/E45.001
2013/0009125 A1 1/2013 Park
2015/0115215 A1 * 4/2015 Tsao ..................... H10N 70/231 257/4
2016/0276585 A1 * 9/2016 Kim ..................... H10N 70/231
2018/0090542 A1 * 3/2018 Gourvest ............... H10B 63/82
2019/0288192 A1 * 9/2019 Takahashi .......... H10N 70/8616
2020/0381617 A1 * 12/2020 Boivin .................. H10B 63/82
2020/0395408 A1 * 12/2020 Takahashi ............ H10B 63/845
2021/0288250 A1 * 9/2021 Li ......................... H10N 70/011
2021/0391535 A1 12/2021 Li et al.
2022/0102626 A1 * 3/2022 Li ...................... H10N 70/8828
2022/0102627 A1 * 3/2022 Ok ..................... H10N 70/8828
2022/0165949 A1 * 5/2022 Brew .................. H10N 70/231
2022/0181546 A1 * 6/2022 Ok ......................... H10B 63/80
2023/0093604 A1 * 3/2023 Ok ....................... H10N 70/231 257/4
2023/0180640 A1 * 6/2023 Cheng .................. H10N 70/841 257/4

FOREIGN PATENT DOCUMENTS

EP 3288092 B1 9/2021
GB 2644582 A 4/2026
KR 10-2025-0123909 A 8/2025
WO 2024/252206 A1 12/2024

OTHER PUBLICATIONS

Guy M. Cohen, et al. Parallel Computation on Input Vectors by Orthogonal Representation. U.S. Appl. No. 18/131,641, filed Apr. 6, 2023. p. 28.

Pengfei Guo, et al. A Review of Germanium-Antimony-Telluride Phase Change Materials for Non-Volatile Memories and Optical Modulators. Applied Sciences. 2019, 9, 530 p. 26.

Abu Sebastian, et al. Tutorial: Brain-inspired computing using phase-change memory devices. Journal of Applied Physics 124, 111101 (2018). p. 16.

Seungchul Jung et al., A crossbar array of magnetoresistive memory devices for in-memory computing. Nature, vol. 601, Jan. 13, 2022. p. 17.

Peter Mell and Timothy Grance, The NIST Definition of Cloud Computing, NIST Special Publication 800-145, Sep. 2011, cover, pp. i-iii and 1-3.

James D. Plummer et al., Silicon VLSI Technology: Fundamentals, Practice, and Modeling 1st Edition, Prentice Hall, 2001. p. 817.

P.H. Holloway et al., Handbook of Compound Semiconductors: Growth, Processing, Characterization, and Devices, Cambridge University Press, 2008. p. 926.

China National Intellectual Property Administration. Authorized officer: BAI, RuoGe. ISR & WO. PCT/IB2024/054469. Aug. 7, 2024. p. 7.

Intellectual Property Office, "Request for the Submission of an Opinion," Nov. 26, 2025, 14 Pages, KR Application No. 10-2025-7024077.

Intellectual Property Office, "Written Decision on Registration," Feb. 10, 2026, 10 Pages, KR Application No. 10-2025-7024077.

* cited by examiner

PHASE CHANGE MEMORY LAYER AND SEED LAYER WITH ALIGNED OUT-OF-PLANE CRYSTALLINE AXES

BACKGROUND

The present invention relates generally to the electrical, electronic and computer arts and, more particularly, to phase change memory (PCM).

Phase change memory (PCM) employs a phase change material (also abbreviated as PCM; the skilled artisan will appreciate from the context whether "memory" or "material" is intended) employs a material that can exist in two phases, namely, a (poly)crystalline phase and an amorphous phase. One exemplary class of phase change materials includes Germanium-antimony-tellurium (GST) alloys, which are a type of phase change material from the general group of chalcogenide glasses. GST225 ($Ge_2Sb_2Te_5$) is one non-limiting example. Phase change memory cells can store a bit (0 or 1) by changing the phase of the phase change material. A typical device has phase change material sandwiched between two contacts. If the phase change material is in the crystalline phase, the phase change material is relatively conductive, and passes a relatively large current. If the phase change material is in the amorphous phase, the phase change material is relatively resistive, and passes a relatively low current. Phase-change memory is non-volatile; once the material is crystalline, it stays crystalline; once the material is amorphous, it stays amorphous (provided the material is kept below the crystallization temperature).

One prior-art "mushroom" PCM cell includes a polycrystalline PCM region and may or may not have a projection liner. Another prior art "mushroom" PCM cell includes superlattices (alternating layers of two different phase change materials, or alternating layers of phase change material and $TiTe_2$). There are known single-crystal PCM devices that require growth on a Si (111) substrate where the substrate serves as a growth template.

BRIEF SUMMARY

Principles of the invention provide a phase change memory cell with a crystalline structure aligned to a seed layer. In one aspect, an exemplary phase change memory cell includes: an insulating layer; a first electrode embedded in the insulating layer, wherein an outer end of the first electrode is locally flush with an outer surface of the insulating layer; a second electrode, larger than the first electrode, and spaced from the first electrode; a compositionally homogenous crystalline phase change material layer; and a highly oriented seed layer. A crystal structure of the homogenous phase change material layer is correlated with a crystal structure of the highly oriented seed layer, and the compositionally homogenous phase change material layer and the highly oriented seed layer are located at least partially between the first and second electrodes.

Optionally, the compositionally homogenous phase change material layer and the highly oriented seed layer are of different materials.

Optionally, the seed layer has an out-of-plane crystalline axis and the homogenous phase change material layer has an out-of-plane crystalline axis aligned to the out-of-plane crystalline axis of the seed layer.

In another aspect a phase change memory array of such phase change memory cells includes a plurality of horizontal lines; a plurality of vertical lines intersecting the plurality of horizontal lines at a plurality of cell locations; a plurality of phase-change memory cells located at each of said plurality of cell locations; and a plurality of transistors associated with each of the plurality of phase-change memory cells. Each of the phase-change memory cells comprises: an insulating layer; a first electrode embedded in the insulating layer, wherein an outer end of the first electrode is locally flush with an outer surface of the insulating layer; a second electrode, larger than the first electrode, and spaced from the first electrode; a compositionally homogenous crystalline phase change material layer; and a highly oriented seed layer, wherein a crystal structure of the homogenous phase change material layer is correlated with a crystal structure of the highly oriented seed layer. The compositionally homogenous phase change material layer and the highly oriented seed layer are located at least partially between the first and second electrodes.

In a further aspect, a method of forming a phase change memory cell includes providing a starting structure comprising a substrate, an insulating layer outward of the substrate, and a first electrode embedded in the insulating layer. An outer end of the first electrode is locally flush with an outer surface of the insulating layer. Further steps include depositing a highly oriented crystalline seed layer on an outer surface of the insulating layer and the outer end of the first electrode; epitaxially growing a compositionally homogenous crystalline phase change material layer on the highly oriented crystalline seed layer; and depositing a top electrode material on the compositionally homogenous crystalline phase change material layer.

In yet a further aspect, another method of forming a phase-change memory cell includes providing a starting structure comprising a substrate, an insulating layer outward of the substrate, and a first electrode embedded in the insulating layer. An outer end of the first electrode is locally flush with an outer surface of the insulating layer. Further steps include depositing an amorphous phase change material layer on an outer surface of the insulating layer and the outer end of the first electrode; depositing a highly oriented crystalline seed layer on an outer surface of the amorphous phase change material layer at a temperature below a crystallization temperature of the first amorphous phase change material layer, to produce a resultant structure; and annealing the resultant structure at a temperature above the crystallization temperature of the first amorphous phase change material layer to induce a solid phase crystallization of the amorphous phase change material layer by templating from the seeding layer.

In still a further aspect, still another method of forming a phase-change memory cell includes providing a starting structure comprising a substrate, an insulating layer outward of the substrate, and a first electrode embedded in the insulating layer. An outer end of the first electrode is locally flush with an outer surface of the insulating layer and the insulating layer is amorphous. Further steps include preparing an outer surface of the amorphous insulating layer to cause orientation of a subsequently epitaxially grown compositionally homogenous crystalline phase change material layer; epitaxially growing the compositionally homogenous crystalline phase change material layer on the prepared outer surface of the amorphous insulating layer at a temperature such that compositionally homogenous crystalline phase change layer grows in a crystalline manner; and depositing a top electrode material on the compositionally homogenous crystalline phase change material layer.

In an even further aspect, a hardware description language (HDL) design structure is encoded on a machine-readable data storage medium. The HDL design structure includes elements that when processed in a computer-aided design system generate a machine-executable representation of a phase change memory cell and/or array, as described.

As used herein, "facilitating" an action includes performing the action, making the action easier, helping to carry the action out, or causing the action to be performed. Thus, by way of example and not limitation, instructions executing on one processor might facilitate an action carried out by semiconductor processing equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

- phase change memory with low RESET current (e.g., due to the presence of van der Waals gaps),
- phase change memory with large $R_{RESET}/R_{SET}$ window (i.e., high ratio of the resistances in the two different states, SET and RESET—depending on the application, the higher resistance ($R_{RESET}$) is, for example, more than 10 or, for example, preferably more than 100 of the lower resistance, $R_{SET}$),
- phase change memory with higher programming endurance (i.e., a large number of SET-RESET cycles before the device fails—depending on the application, for example, at least $10^9$ cycles before failure),
- phase change memory with good retention (e.g., programed state maintained at least 10 years if device operated in the proper temperature range),
- phase change memory with low resistance drift (due to the epitaxial structure—when device is placed in a given resistance state, it maintains the resistance level with little or no change during the time period that it is required to maintain the stored data—particularly helpful when using devices with intermediate states to store more than one bit, or for analog artificial intelligence (AI) computations), and
- Lower device variability due to the use of epitaxial material vs. polycrystalline material.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
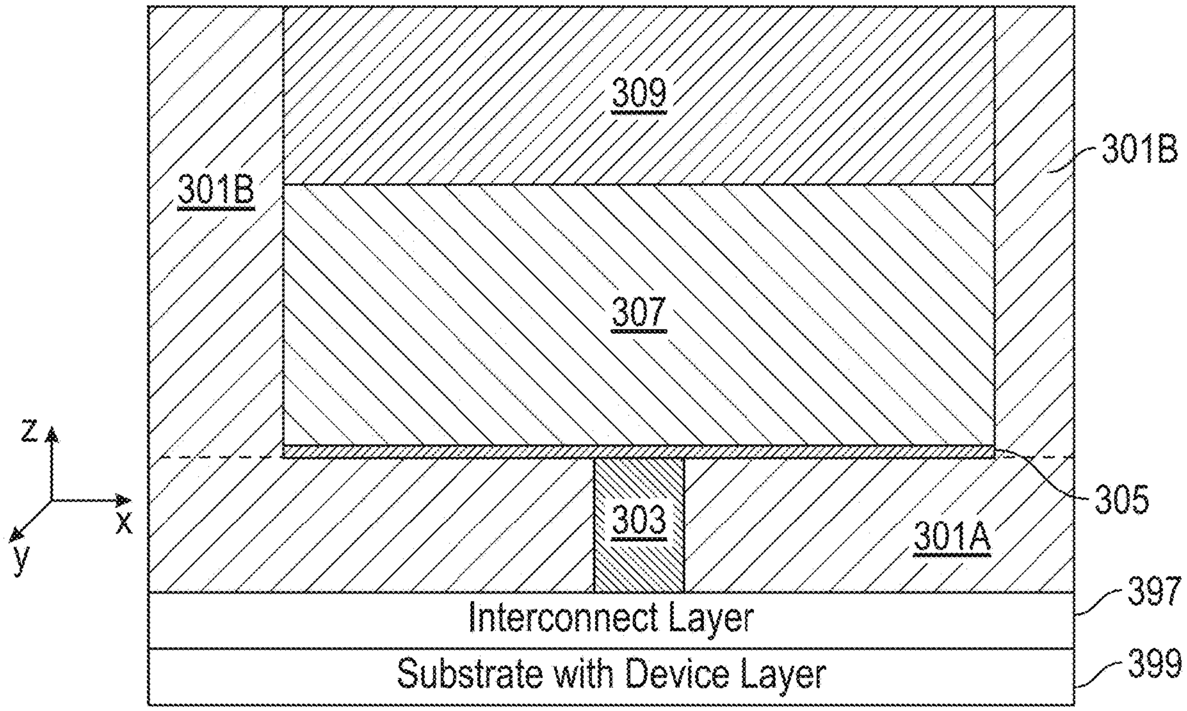
FIG. 1 shows an embodiment of a phase change memory cell, according to an aspect of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments advantageously provide a PCM cell with a homogeneous single crystal phase change material layer with its crystal plane aligned to crystal plane(s) of seed layer(s). The single-crystal PCM is said to template from the seed layer, such that the PCM layer mimics at least one aspect of the order provided by the seed layer. An exemplary phase change memory includes, for example a homogenous phase change material layer with out-of-plane crystalline axis aligned to a crystalline seed layer's out-of-plane crystalline axis. The seed layer can include, for example, $Ti_xTe_y$ or $Sb_xTe_y$. The seed layer can be first, last, or intermediate. One or more embodiments provide a single crystal homogenous phase change material layer on a non-planar electrode substrate with an out-of-plane crystalline axis perpendicular to the substrate. An exemplary method to form a phase change memory (PCM) includes preparing the surface (e.g., electrically charging a substrate with Ar sputtering, or an electron beam), followed by crystalline deposition of a seed layer at a first optimized temperature, followed by crystalline deposition of a phase change material layer at a second optimized temperature (with crystalline structure aligned to the seed layer). For example, a seed layer of $TiTe_2$ can be deposited at a substrate temperature of 150 C to 250 C, and a PCM layer of GST225 can be deposited at a temperature of 150 C to 250 C. In yet another example both the $TiTe_2$ layer and the GST225 layer are deposited at the same temperature (e.g. 200 C). For example, form a lower electrode embedded in an insulating material, deposit a thin (0.25-5 nm) crystalline seed layer with a crystalline z-axis orientation perpendicular to the substrate, deposit a crystalline phase change material layer with oriented z-axis aligned to the seed layer z-axis, and deposit top electrode material. In another example, deposit a first amorphous PCM layer; deposit a seeding layer at a temperature below the crystallization temperature of the first amorphous PCM layer, wherein the seeding layer is a highly oriented crystalline layer; and anneal at a temperature above the first PCM layer crystallization temperature, to induce a top-down solid phase crystallization of first PCM layer by templating from the seeding layer. With regard to the "highly oriented" crystalline layer, in practice, the seed layer (or the PCM layer that follows) is not a perfect single-crystal, but a polycrystalline layer where the polycrystals are nearly all oriented in the same direction. Furthermore, the polycrystals are typically very large. By "large" is meant that comparing with the size of the device, the polycrystals are many time the size of a device. Thus, in one or more embodiments, the highly oriented seed layer is not a single crystal; rather, it has crystallites but they are all largely oriented in the same way, at least in one dimension/axis. In two adjacent crystallites, the atomic layers will be parallel to the substrate, but the two crystallites may be rotated with respect to each other so that the atomic layers may not necessarily be aligned with respect to other axes. In one or more embodiments, alignment along at least one direction is adequate. It is noted that use of templates in accordance with one or more embodiments may be particularly advantageous for back end of line processing when access to a crystalline Si (111) substrate, as required by some prior art techniques, is not available. Stated in another way, a "highly oriented" crystalline film is a layer that is composed of polycrystalline domains, where all of these domains are closely aligned with each other (in one or more directions). Experimentally, this can be observed using x-ray diffraction. When a film is polycrystalline with all domains (or crystallites) randomly oriented, hardly any of the crystallites will match the diffraction condition and there would be no diffraction peak observed. But in a highly oriented crystalline film most of the crystallites will match with the diffraction condition (at a specific beam orientation) and a clear diffraction peak will be observed. In the limit of perfect alignment of all crystallites the material will approach a single-crystal film. Note that there could be an arrangement of the crystallites where all crystallites have the atomic planes parallel to the substrate surface, but each crystallite is rotated in plane by some random degree. In this case diffraction from the atomic planes parallel to the surface will show good crystallinity (strong diffraction peak) but diffraction form asymmetric plane (e.g., atomic planes at some angle to the surface) will be similar to random polycrystalline material (no diffraction peak).

Note that the epitaxial process of growing the homogeneous single-crystal layer can be referred to as "homoepitaxy" while growth of the superlattice can be referred to as "heteroepitaxy."

Some prior art devices require an Si (111) substrate as a seeding template for a homogeneous single-crystal phase change layer; in contrast, one or more embodiments are substrate orientation-independent and at least somewhat substrate material-independent (since the charge deposited in the surface of the substrate (e.g. by Ar sputtering) helps with the orientation of the seed layer, it is not clear how much the epitaxy will change if the top surface of the substrate is highly conductive and cannot hold the charge). This is not an issue for PCM devices since the bottom electrode is embedded in silicon nitride or oxide which are insulators and hold charge well. Some prior art devices utilize a superlattice structure, whereas one or more embodiments employ a bulk homogeneous polycrystalline PCM material; for example, GST225 or other stoichiometries or $Sb_2Te_3$ or other stoichiometries, with optional doping (example dopants: SiC, Si, $SiO_2$, SiN). In one or more embodiments, the seed layer can be up to 5 nm thick and down to a single monolayer of thickness, to minimize impact on electrical characteristics.

Purely by way of example and not limitation, exemplary configurations of seed layer+homogeneous phase change material for an exemplary PCM cell include:

seed layer 0.25-5 nm $TiTe_2$/PCM layer 1-100 nm $Sb_2Te_3$ seed layer 0.25-5 nm $TiTe_2$/PCM layer 1-100 nm $Ge_2Sb_2Te_5$ seed layer 0.25-5 nm $Sb_2Te_3$/PCM layer 1-100 nm $Ge_2Sb_2Te_5$ first seed layer 0.25-5 nm $TiTe_2$/second seed layer 1-5 nm $Sb_2Te_3$/PCM layer 1-100 nm $Ge_2Sb_2Te_5$ PCM layer 1-100 nm $Ge_2Sb_2Te_5$/seed layer 0.25-5 nm $TiTe_2$ (Top-down crystallization with seeding layer on top of PCM).

As appropriate, any of the above embodiments can optionally include dopants (e.g., C, SiC, Si, SiN, $Ta_xO_y$, N, O) included in the seed layer, PCM layer, or both. As appropriate, any of the above embodiments can optionally have modified stoichiometries in the seed layer, PCM layer, or both. The impact of doping on the epitaxy will typically depend on the dopant used. For example, carbon is known to retard crystallization of amorphous GST but probably can be incorporated during epitaxial growth. Oxygen may prohibit epitaxy as it may lead to the formation of an amorphous GST oxide layer (so basically negating the template effect). Doping using carbon and/or silicon is presently believed to be potentially helpful, as these just substitute for Ge.

Referring now to FIG. 1, note an embodiment including an inner insulating layer 301A, a bottom electrode 303, a crystalline seed layer 305 (in this case, non-PCM), a crystalline homogeneous PCM layer 307, top electrode 309, and outer insulating layer 301B. Below inner insulating layer 301A there may be, for example, layers of interconnects 397, and a silicon substrate 399 with circuits built of transistors (such as metal-oxide semiconductor field effect transistors (MOSFETs), as would be apparent to the skilled artisan, given the teachings herein). In the depicted exemplary embodiment, the z-axes of the crystalline PCM layer 307 and the crystalline seed layer 305 are aligned. In this aspect, for example, grow the material 307 in crystalline form at high temperature (e.g., 180-200 C) on the seed layer 305. The PCM grows epitaxially on the highly oriented seeding layer 305. In some cases, the high temperature can be higher than the crystallization temperature of the PCM layer 307; however, this is not a requirement. Indeed, generally, the growth temperature may be lower than the crystallization temperature of the PCM. Since the crystallization temperature of PCM is defined for spontaneous crystallization of amorphous PCM, and in this case the PCM is epitaxially grown using a template, it is acceptable to use a growth temperature which is higher than the above mentioned temperature, but is not necessary.

Figure 6:
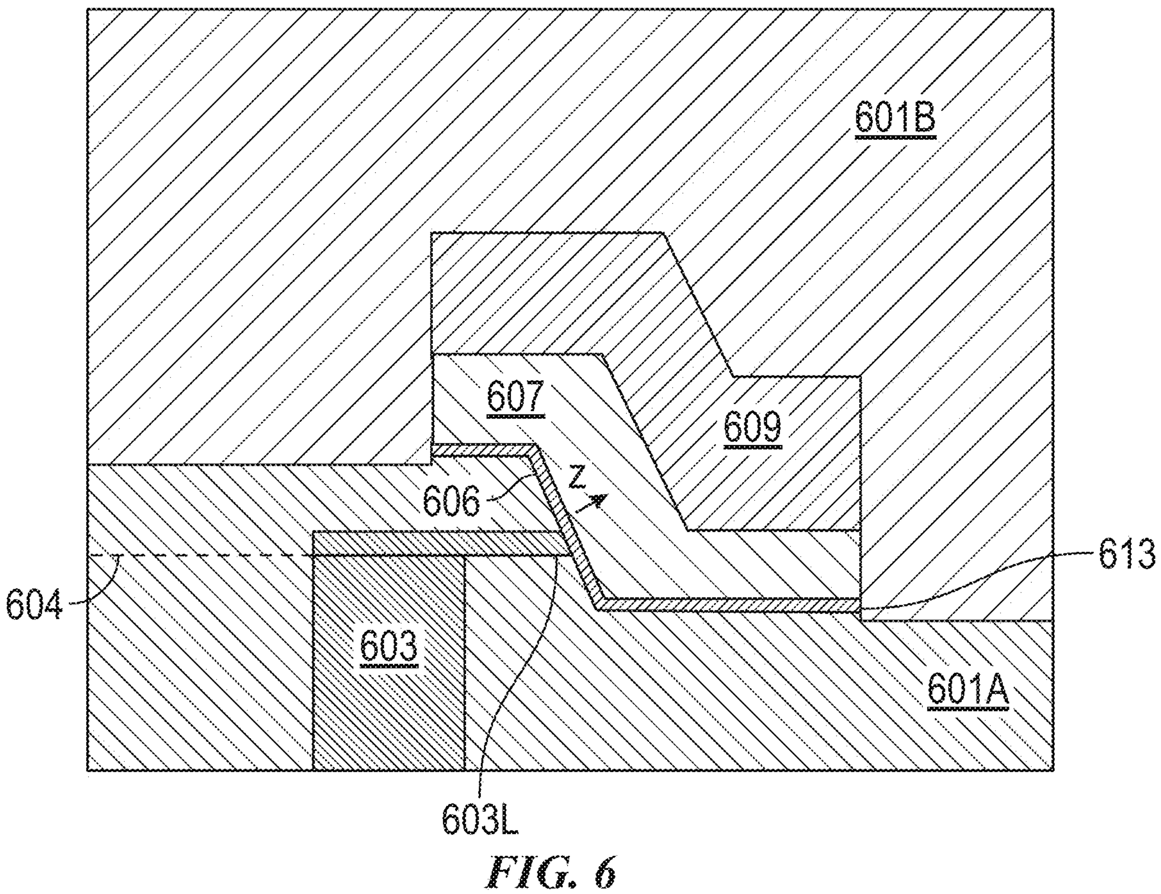
FIG. 6 shows an embodiment of a phase change memory cell, according to an aspect of the invention.
Figure 7:
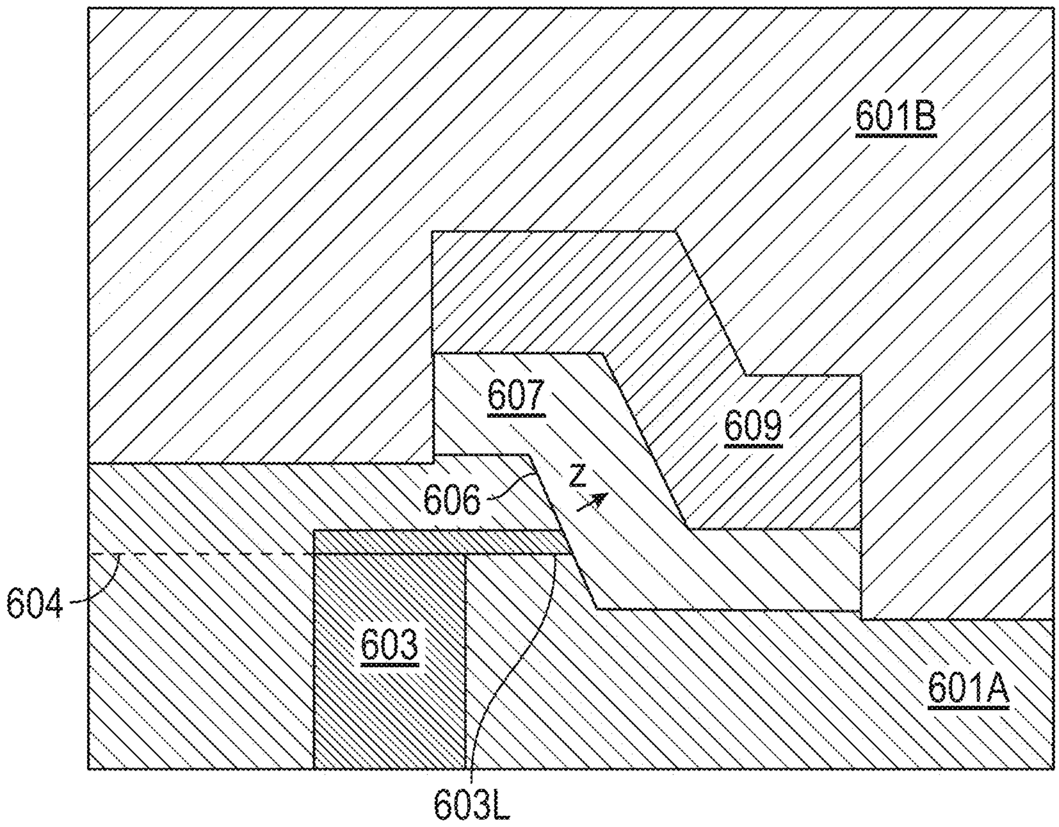
FIG. 7 shows an embodiment of a phase change memory cell, according to an aspect of the invention.

Note that all the illustrated embodiments, including those of FIGS. 6 and 7, can have layers 397, 399, but for illustrative convenience, these are shown only in FIG. 1. In one or more embodiments, begin with layers 399, 397, 301A, and lower electrode 303 flush with the top layer of 301A. Then, deposit 305, 307, 309 as blanket layers and use patterning/lithography to make the device stacks from 305, 307, 309, and deposit insulation 301B on the sides which could generally be the same or different material as compared to 301A (regions 301A and 301B are accordingly separated by a dotted line).

In one or more embodiments, epitaxially grow, on the seed layer, homogeneous crystalline material with van der Waals gaps, without the use/formation of multilayers or a superlattice.

Seed layer 305 can be deposited at a temperature high enough so it is crystalline. The wafer is then allowed to cool down and then PCM layer 307 is deposited at a temperature low enough (for example, room temperature) so PCM layer 307 is amorphous. The wafer is then annealed at a temperature high enough (for example, 200 C for GST 225) to allow for a solid phase growth of PCM 307 layer into an ordered crystal by templating from seed layer 305. The rest of the fabrication steps remain the same.

Figure 2:
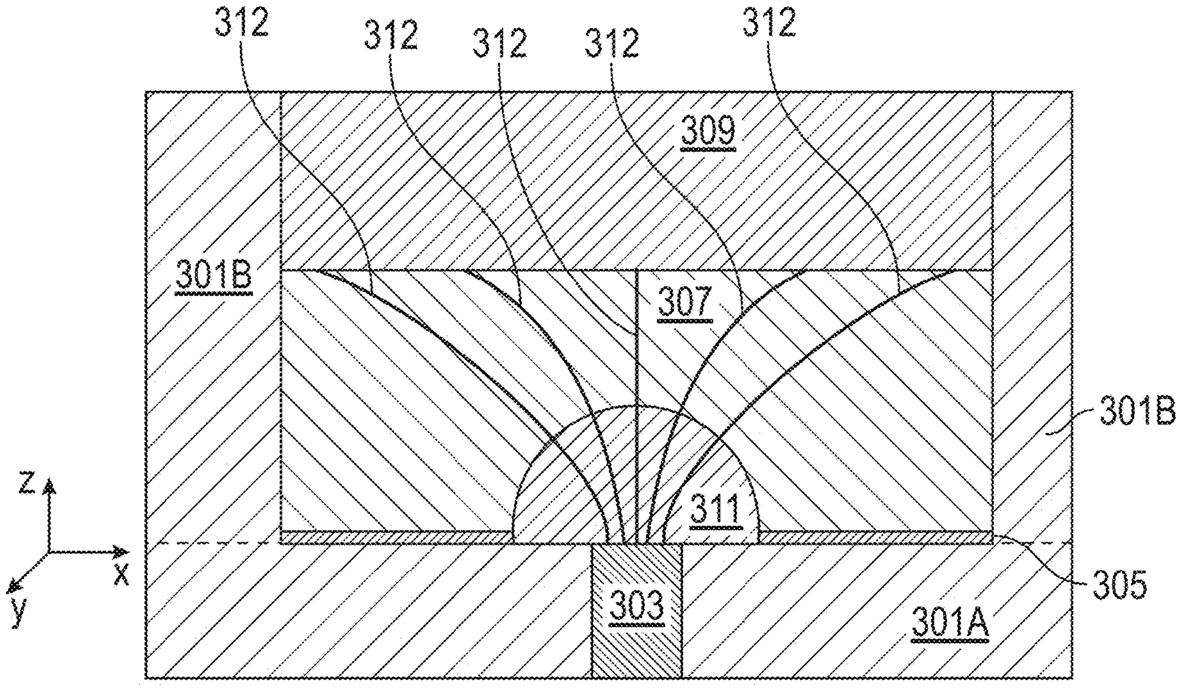
FIG. 2 shows the embodiment of FIG. 1, with a PCM switching region, according to an aspect of the invention.

FIG. 2 shows the embodiments of FIG. 1 wherein a dome of amorphous PCM material 311 has been formed. Note that the seed layer has disappeared under the region 311, while the seed/templating layer 305 remains under the crystalline homogeneous PCM layer 307. The dome and bottom electrode together form a "mushroom shape" including the bottom electrode as the "stem" of the mushroom and region 311 as the "dome" of the mushroom. Note that the dome of amorphous PCM can re-crystallize upon SET pulse using the surrounding crystalline PCM material as a template. In one or more embodiments, since material 307 is homogeneous, when there is melting and recrystallization, the same composition remains no matter how much material has melted. In contrast, in prior art techniques using multilayers/superlattice, if the first 2 layers are melted during RESET, the mixed material will have intermixing of those 2 layers. Suppose another RESET melting yields a bigger dome, melting together the first three layers—this will result in a different composition. Advantageously, in one or more embodiments of the present invention, the PCM material is homogeneous and RESET will not change the composition of the PCM.

Regarding RESET, this operation typically involves applying a high current pulse to the device ("high" means providing enough energy to melt the PCM adjacent to the bottom electrode). The RESET pulse is quickly quenched/shut down to force a fast cooling of the melt, which then solidifies in the amorphous phase. If the current pulse tapers slowly (by having a long trailing edge) the melt will solidify in the crystalline phase as it would have sufficient time to crystallize. Note that, given the teachings herein, the skilled person can determine required currents and waveforms for particular geometries using known techniques such as coupled thermal-electrical finite element analysis. The maximum current density is where the bottom electrode 303 meets material 307. The material melts, forming the dome 311. Lines 312 represent the current density. If the pulse is drawn as a function of time, quenching means that the trailing edge of the pulse drops abruptly. This abrupt drop-off causes the molten material to quickly cool off without crystalizing. The effect is that the bottom electrode (which is one of the contacts) has been covered with the dome 311 of (high-resistance) amorphous material, which blocks current. One FOM (figure of merit) for PCM devices is to have the lowest possible RESET current. One technique is to make the bottom electrode 303 as small as possible, as discussed elsewhere herein. Another approach is to use a doped PCM, where additives such as oxygen and/or nitrogen are added. The additives typically "decorate" the grain boundaries between the grains in the polycrystalline material. This has the effect of making the material more resistive and lowering the RESET current.

In one or more embodiments, when carrying out melting and recrystallization using a rapid quench, a second, less intense pulse can be applied, which anneals the material above the crystallization temperature but does not need to melt it. In another approach, employ a RESET pulse but do not use an abrupt trailing edge; rather, cool slowly to recrystallize the PCM. In FIG. 2, even when material is melted near the bottom electrode 303, the material that melted will see the top part of 307, which remained crystalline, as a template and follow the template during recrystallization. Further regarding the "rapid" quench, the same has to be fast enough such that the melt solidifies in the amorphous phase. This varies depending on the PCM material used. For example, for GST 225, the trailing edge of the RESET pulse is on the order of several nanoseconds. Further regarding the "less intense" pulse, the same is defined as a pulse that would lead to crystallization of the PCM material. For example, for GST 225, it is typically a pulse that has a long trailing edge of several tens of nanoseconds or more. Again, given the teachings herein, the skilled person can determine required currents and waveforms for particular geometries using known techniques such as coupled thermal-electrical finite element analysis.

Figure 3:
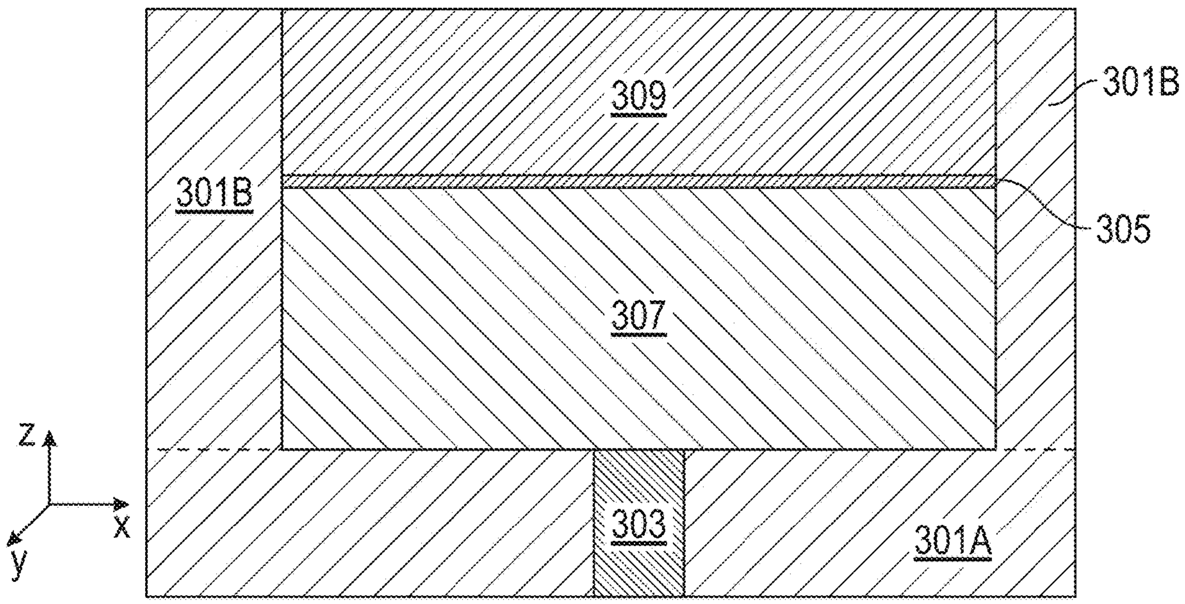
FIG. 3 shows an embodiment of a phase change memory cell, according to an aspect of the invention.

In FIG. 3, note an embodiment including an inner insulating layer 301A and outer insulating layer 301B, a bottom electrode 303, a crystalline seed layer 305 (in this case, non-PCM), a crystalline homogeneous PCM layer 307, and top electrode 309. In the depicted exemplary embodiment, the z-axes of the crystalline PCM layer 307 and the crystalline seed layer 305 are aligned. In this embodiment, the seed layer 305 is outward of the PCM layer 307. Having the seed layer 305 on top of layer 307 has certain advantages. Having the seed layer on the bottom between the bottom electrode 303 and the layer 307 could affect the contact of the bottom electrode to the PCM layer. In many cases, the seed layer is not itself a PCM. Direct contact of the bottom electrode to the epitaxial PCM layer, as in FIG. 3, is desirable.

Figure 10A:
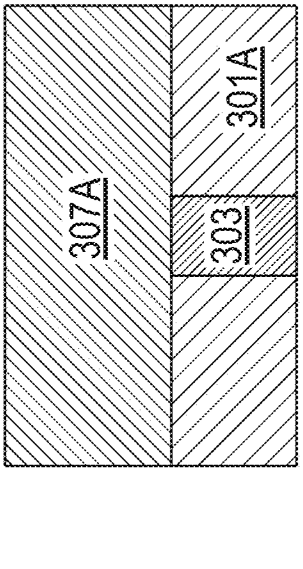
FIGS. 10A-10D show an exemplary series of steps in manufacturing a phase change memory cell according to the embodiment of FIG. 3, according to an aspect of the invention.
Figure 10B:
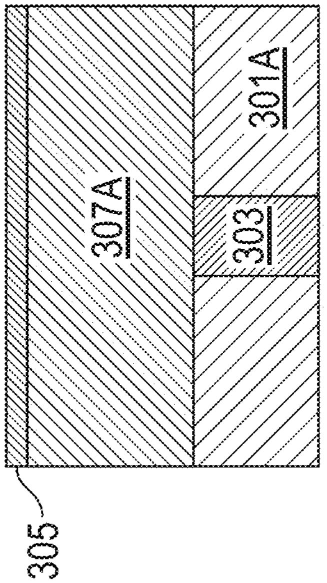
Figure 10C:
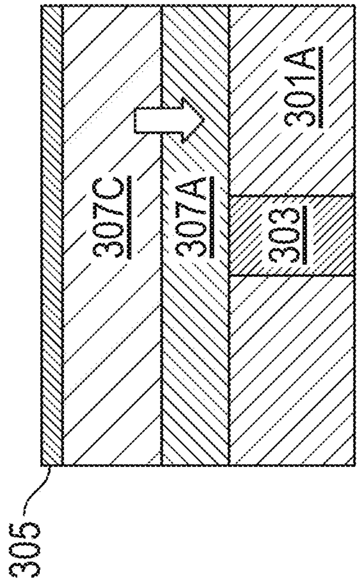
Figure 10D:
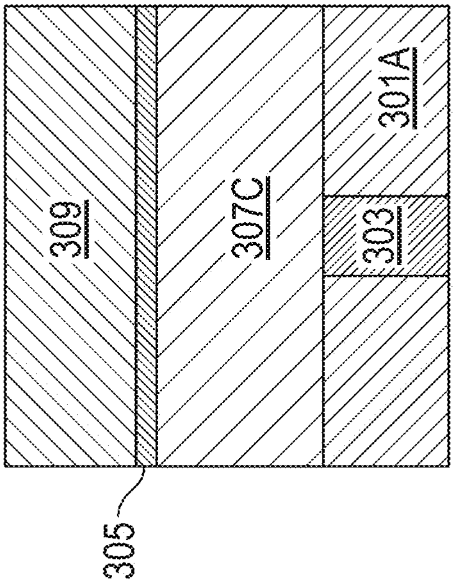

Refer now to FIGS. 10A-10D. In FIG. 10A, deposit amorphous PCM 307A on the inner insulating layer 301A. Deposition of PCM at, e.g., room temperature, results in amorphous PCM. Generally, to obtain amorphous PCM, the substrate temperature should be maintained below the crystallization temperature of the PCM material. For example, for GST 225, the crystallization temperature is about 165 C. In FIG. 10B, deposit the highly oriented seeding layer 305 on top of amorphous PCM 307A. In the annealing step of FIG. 10C, carry out solid phase epitaxy, which means that the PCM 307A crystallizes from the top—note crystalline PCM 307C and remaining amorphous portion 307A. The completion of this process results in crystalline PCM 307C throughout in FIG. 10D, with upper electrode 309 on top. Note that a sputtering clean step may optionally be used after the amorphous PCM deposition, to clean the oxide that may form during temperature ramp-up to the deposition temperature of the seeding layer. Furthermore, this sputtering clean may deposit charge into the PCM layer surface which may be useful to orient the seeding layer. Advantageously, the bottom electrode 303 is in direct contact with PCM 307C, with no interface present. The structure in FIG. 10D is ready to use, as compared to the embodiment of FIG. 1 with the seed layer 305 at the bottom of PCM 307, which requires cycling before use.

In one or more embodiments, the bottom electrode 303 is significantly smaller than the top electrode 309, and the top electrode 309 extends over the whole cell. In FIG. 2, the dome 311 forms at the bottom because that is where the current density is greatest. The highest current density is right over the bottom electrode 303. Typically, the smaller the diameter of the bottom electrode 303, the better (higher current density means lower RESET current). The diameter of the bottom electrode 303 should typically be the smallest the given technology can achieve (in current technology the bottom electrode is about 30 nm in diameter; that will change (decrease) as fabrication technology advances). Generally, in one or more embodiments, the bottom electrode 303 has a diameter of 30-40 nm (20 nm is believed to be better if available under the particular technology node and process conditions) and the top electrode 309 has a diameter of a few hundred nm.

Figure 4:
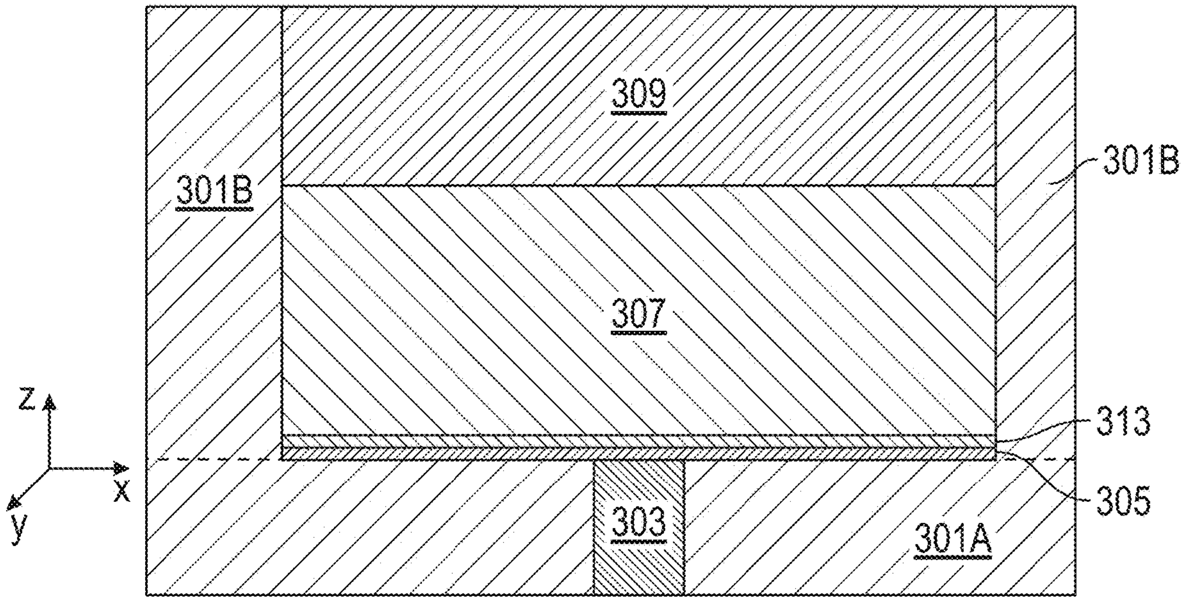
FIG. 4 shows an embodiment of a phase change memory cell, according to an aspect of the invention.

FIG. 4 shows an embodiment, generally similar to the embodiment of FIG. 1, except that a dual seed layer is employed, including crystalline (non-PCM) seed layer 305 outward of the inner insulating layer 301A and crystalline (PCM) seed layer 313 outward of crystalline (non-PCM) seed layer 305 and inward of PCM 307. Thus, FIG. 4 shows an embodiment with a crystalline non-PCM seed layer followed by a crystalline PCM seed layer.

Note that generally, seeding material can be a PCM but is not necessarily limited to PCM. $Sb_2Te_3$, which is a PCM, is used for the seed layer in one or more non-limiting exemplary embodiments.

Figure 5:
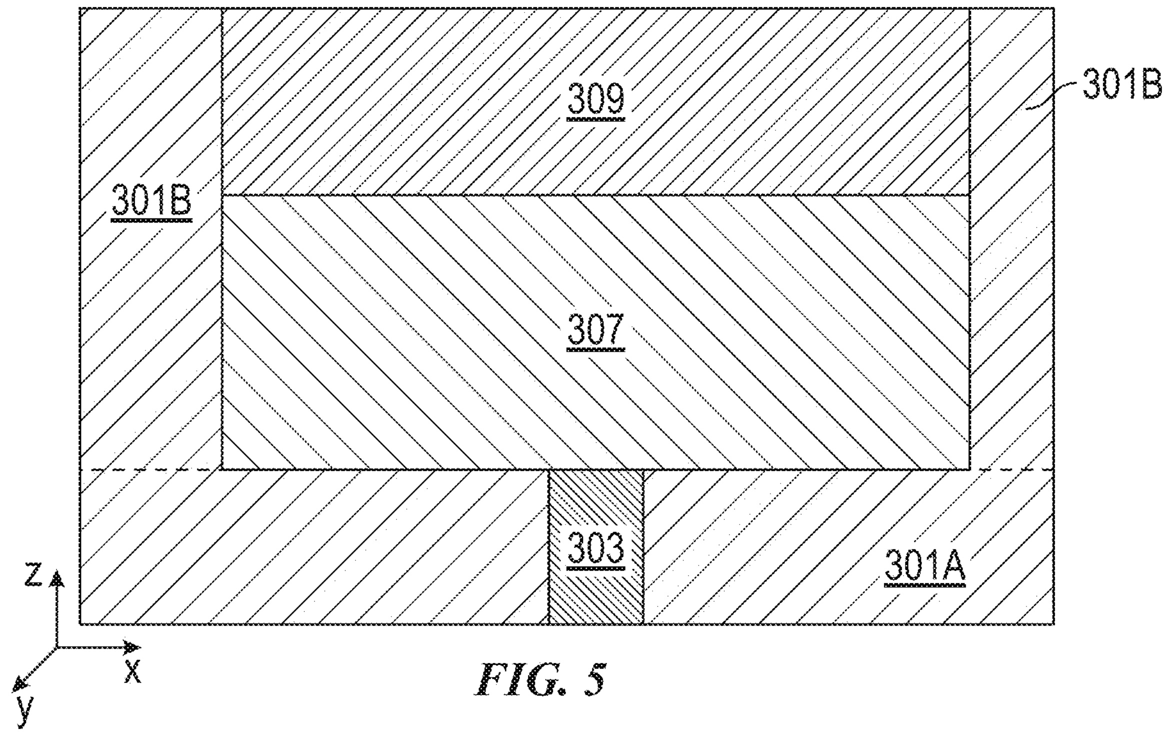
FIG. 5 shows an embodiment of a phase change memory cell, according to an aspect of the invention.

FIG. 5 shows an embodiment, where a separate seed layer is not employed. Rather, the entire crystalline homogeneous PCM layer 307 is grown as, for example, $Sb_2Te_3$. The seeding layer is the PCM in this aspect. In the exemplary embodiment of FIG. 5, the surface on which layer 307 is deposited is amorphous (e.g. $Si_3N_4$ or $SiO_2$) and therefore cannot serve as a template. It is worth noting that certain prior art devices used the surface of a (crystalline) Si (111) substrate as the template for PCM layer growth. Note also that $Sb_2Te_3$ is not necessarily the best PCM for all applications; in our experiments on other configurations, we used $TiTe_2$ as a seed layer (which is not a PCM and therefore cannot be used as layer 307 in the embodiment of FIG. 5). In the example of FIG. 5, layer 307 is a PCM with the property of serving as a seeding layer, which means it grows as a highly oriented layer. Generally, for embodiments employing a separate seed layer (i.e. other than FIG. 5 and FIG. 7), the seed layer can be either PCM or non-PCM.

FIG. 6 shows an embodiment, where the bottom electrode is part of a layer in the stack and the device is built on the side. Note the inner insulating layer 601A and outer insulating layer 601B (inner and outer layers can be same or different material); bottom electrode 603 with lateral rightward-extending portion 603L; a crystalline seed layer 613 (seed layer 613 can be either PCM or non-PCM); crystalline homogeneous PCM layer 607; and top electrode 609. In the depicted exemplary embodiment, the z-axes of the crystalline PCM layer 607 and the crystalline seed layer 605 are aligned. The embodiment of FIG. 6 is beneficial, for example, to provide a bottom electrode that is very narrow in at least one dimension (controlled by deposition not lithography). To manufacture the embodiment of FIG. 6, for example, begin with lower electrode 603 and inner insulator 601A up to dotted line 604 (as well as layers 397, 399). The surface symbolized by dotted line 604 will extend over the whole width at this time. Then deposit a thin (e.g., 5 nm) blanket layer of conductor 603L over the top of 601A and add additional insulator 601A up to the upper surface depicted in FIG. 6 (the outmost surface between 601A and 601B will extend over the whole width at this time). At this stage, there is a stack with 601A with a vertical contact 603 and an embedded thin contact layer 603L coincident with the top of that contact and extending across the whole width. That stack is patterned into a ridge, like a fin running left-to-right, and "chop" the fin to make a facet 606 on which the layers 613, 607, 609 will be deposited. The structure is very narrow in the direction perpendicular to the page. The lateral projection 603L from the electrode 603 will have an area equal to the layer thickness (controlled by deposition) times the width of the ridge into the page (controlled by lithography). This allows controlling one dimension of electrode by deposition rather than lithography. Portion 603 can be made in the same manner as FIG. 1 but can be bigger because the dimension of the projection 603L is controlled in this embodiment. The projection 603L can also extend to the left. The upper surfaces of 601A can be aligned with the bottom of layer 613 or recessed below same.

FIG. 7 shows an embodiment, similar to the embodiment of FIG. 6, except that, as in FIG. 5, a separate seed layer is not employed. Rather, the entire crystalline homogeneous PCM layer 607 is grown as, for example, $Sb_2Te_3$. The seeding layer is the PCM in this aspect. In the exemplary embodiment of FIG. 7, the surface on which layer 607 is deposited is amorphous (e.g. $Si_3N_4$ or $SiO_2$) and therefore cannot serve as a template. In the example of FIG. 7, layer 607 is a PCM with the property of serving as a seeding layer, which means it grows as a highly oriented layer. The remainder of the fabrication of the embodiment of FIG. 7 can be similar to that of FIG. 6.

Figure 8:
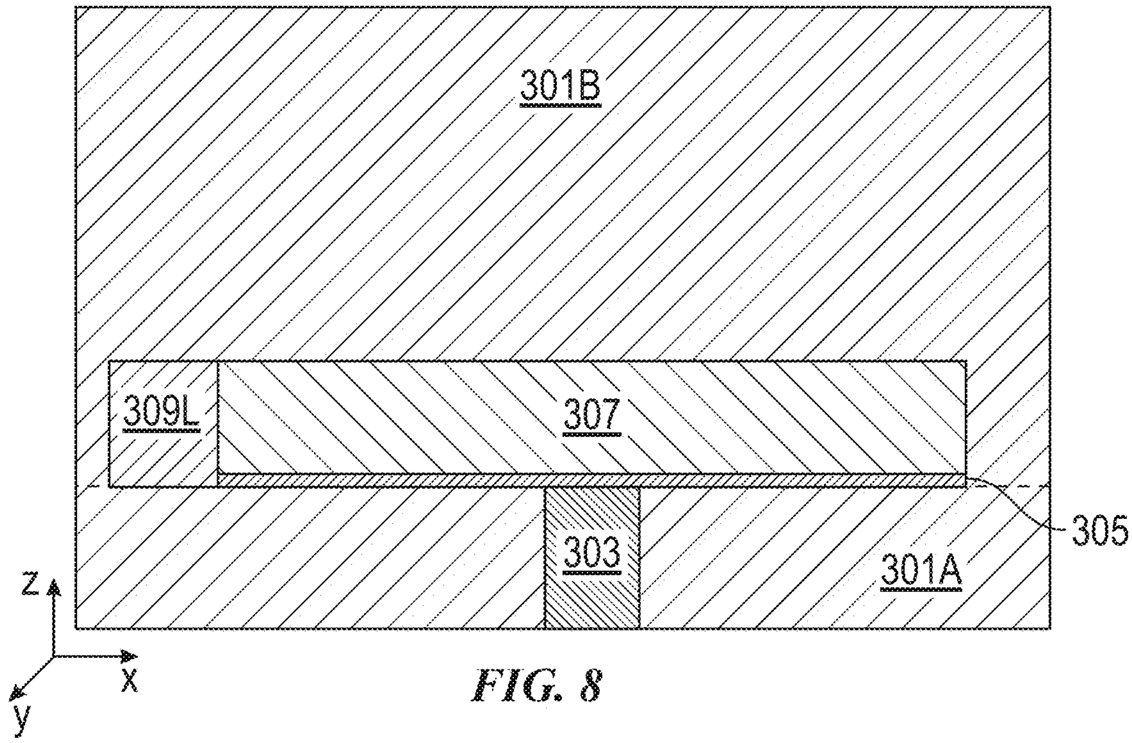
FIG. 8 shows an embodiment of a phase change memory cell, according to an aspect of the invention.

FIG. 8 shows an embodiment, with a lateral electrode 309L. Note the inner insulating layer 301A and outer insulating layer 301B, a bottom electrode 303, a crystalline seed layer 305, a crystalline homogeneous PCM layer 307, and the lateral electrode 309L. In the depicted exemplary embodiment, the z-axes of the crystalline PCM layer 307 and the crystalline seed layer 305 are aligned. Note that for illustrative convenience and generality, only a single lateral electrode 309L is depicted at the left. However, a lateral electrode can also be provided on the right side of the PCM layer 307. Indeed, the PCM layer 307 can be patterned into a mesa structure and the contact can be made to the sidewalls of the mesa. In one non-limiting example, if PCM layer 307 is patterned into a disk (when viewed from above), then the contact will be a ring surrounding the PCM mesa.

Figure 9:
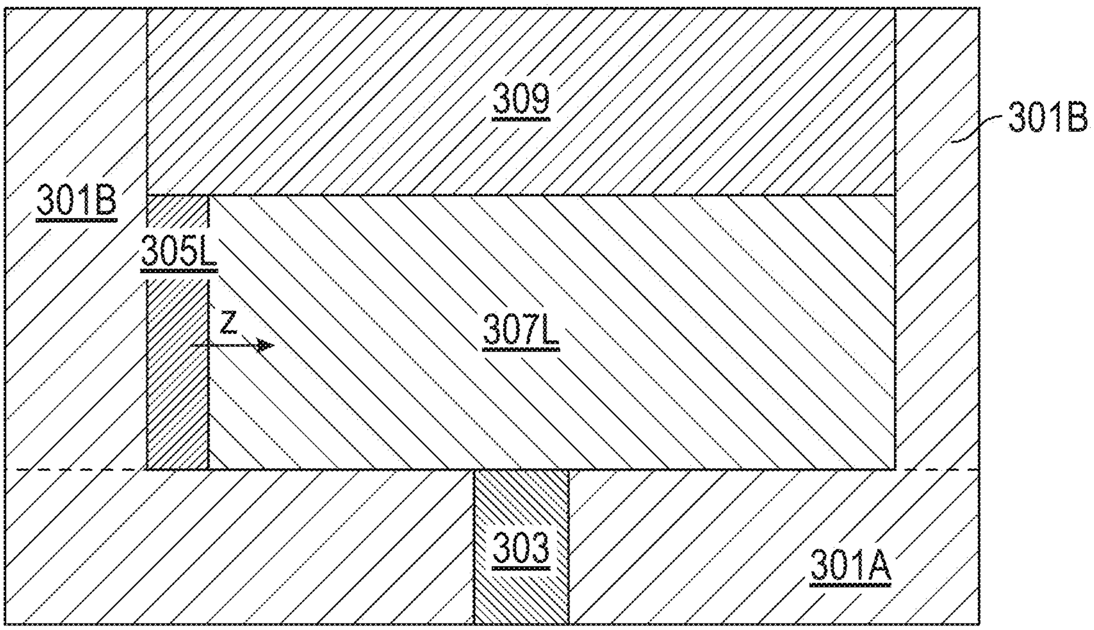
FIG. 9 shows an embodiment of a phase change memory cell, according to an aspect of the invention.

FIG. 9 shows an embodiment, with a lateral crystalline seed layer 305L. Note the inner insulating layer 301A and outer insulating layer 301B, a bottom electrode 303, the lateral crystalline seed layer 305L, a crystalline homogeneous PCM layer 307L, and the top electrode 309. In the depicted exemplary embodiment, the z-axes of the crystalline PCM layer 307L and the lateral crystalline seed layer 305L are aligned. To make this structure, PCM layer 307L is first deposited as an amorphous film (e.g., by depositing at room temperature)(electrode material 309 can also be deposited at this time). The PCM layer and electrode material are patterned (e.g., as a square or rectangle when viewed from above), for example by reactive ion etching, to obtain mesas. Each mesa sidewall is cleaned (for example by Ar sputtering) and the seed layer 305L is deposited. The seed layer deposition can be made, e.g., from the left at an angle, e.g., of 45 degrees, so it only coats the left (or the right if angled from the right) sidewall (the mesa blocks deposition of the material on the opposite sidewall). The wafer is then annealed to allow solid phase epitaxy of the PCM layer 307, which template from the seed layer 305. If the seed layer was present on both sides, the amorphous material would grow crystalline from each side and meet at an undesirable seam or boundary). If it is desired to grow from both sides, the bottom electrode can be displaced from the center of the cell by some amount so it is not near the seam or boundary.

Figure 11:
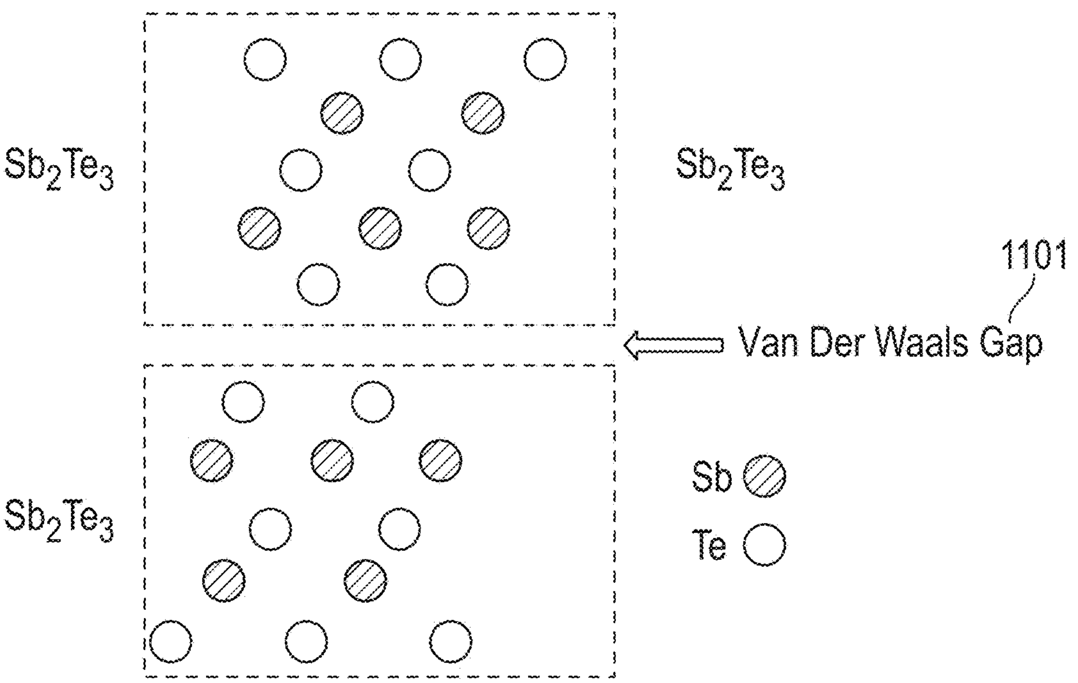
FIG. 11 shows epitaxial growth of PCM on a seed layer, including van der Waals gaps, according to aspects of the invention.

FIG. 11 illustrates certain novel aspects of one or more embodiments. One or more embodiments use known phase change materials, but grown epitaxially on a seed layer. In one or more embodiments, rather than having many randomly oriented crystallites of PCM, the PCM 307, 307L, 607 is a well-ordered crystalline material. Prior art "crystalline" phase change materials are actually polycrystalline. FIG. 11 shows $Sb_2Te_3$ epitaxially grown on a substrate (not shown) with a seed layer (not shown), including atomic layers separated by van der Waals gaps 1101. By employing a nucleation/seed layer (nucleation layer and seed layer are synonyms herein), epitaxially grown PCM with van der Waals gaps 1101 is obtained. Thus, while certain prior art techniques require the substrate to be a template, one or more embodiments do not need the substrate per se to be a template, but rather use a seeding layer on the substrate. In the examples of FIG. 11, the material grows epitaxially with covalent bonds, and after a certain number of atomic layers, it instead forms a "satisfied layer" that is held to the next layer, not by covalent bonding but by van der Waals forces, so that there is literally a gap. We have found embodiments that increase thermal and electrical resistance due to the formation of van der Waals interfaces/gaps. The van der Waals gap location may depend on the material composition. For example, for $Sb_2Te_3$ this will occur every five (5) atomic planes between two Te planes. For GST 225, this takes place at 9 atomic planes, again between Te planes. Thus, generally, in one or more embodiments, the van der Waals gaps occur between Te planes and depending on the PCM composition this could be between about 5 to about 9 atomic planes.

When it is desired to avoid formation of epitaxial (crystalline) GST, deposition can be done at room temperature. For example, 100 nm of GST225 could be deposited on 2.6 nm of $TiTe_2$ at 25 C and the GST would be in an amorphous form. On the other hand, to form epitaxial (crystalline) GST, deposition can be done at an optimized temperature. For example, 100 nm of GST225 could be deposited on 2.6 nm of $TiTe_2$ at 200 C and the GST would be in an epitaxial (crystalline) form, advantageously reducing RESET current. If desired, as, for example, in FIG. 4, utilize a second seed layer and deposit at optimized temperature. For example, 100 nm of GST225 could be deposited on 2.6 nm of $TiTe_2$ with 5 nm of $Sb_2Te_3$ on top of the $TiTe_2$, at 180 C, and the GST would be in an epitaxial (crystalline) form. Thus, one or more embodiments provide for reduction in RESET current without the need for alternating layers/superlattice. It is worth noting that in one or more embodiments, SET resistance is not lowered, but is more resistive due to the van der Waals gaps. Furthermore, a PCM device with a low SET resistance is not desirable since it requires a higher current to RESET.

Figure 12A:
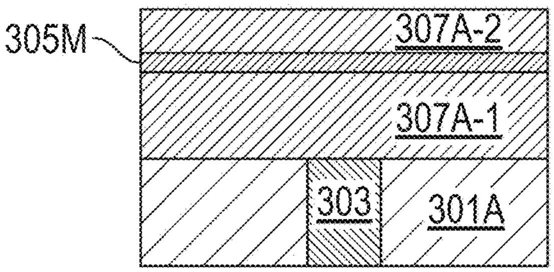
FIGS. 12A and 12B show alternative seed layer locations, according to aspects of the invention.
Figure 12B:
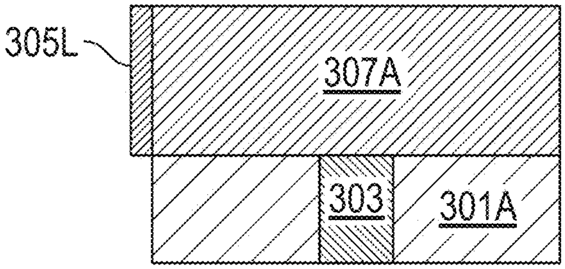

Referring now to FIGS. 12A and 12B, in one or more embodiments, the seeding layer can be placed anywhere as long as it is in contact with the amorphous PCM. For example, it can be placed within the PCM layer (FIG. 12A) or on a sidewall thereof (FIG. 12B). In FIG. 12A, note the inner insulating layer 301A, a bottom electrode 303, the intermediate crystalline seed layer 305M, and the lower and upper amorphous PCM layers 307A-1, 307A-2, which will grow into crystalline form, templating on the seed layer 305M. Compare FIG. 12B to FIG. 9. In FIG. 12B, note the inner insulating layer 301A, a bottom electrode 303, the lateral (on the sidewall) crystalline seed layer 305L, and the amorphous PCM layer 307A, which will grow into crystalline form, templating on the seed layer 305L.

It is worth noting that one or more embodiments employ a highly oriented crystalline layer and the PCM templates on that layer. Optionally, one or more embodiments use crystals in the (111) orientation.

It will thus be appreciated that in one aspect, a phase change memory includes a homogenous phase change material layer with an out-of-plane crystalline axis aligned to the out-of-plane crystalline axis of a crystalline seed layer. The seed layer can be, for example, $Ti_xTe_y$, $Sb_xTe_y$, or the like. In one or more embodiments, a single crystal homogenous phase change material layer is provided on a non-planar electrode substrate with an out-of-plane crystalline axis perpendicular to the substrate. In another aspect, a method to form a phase change memory (PCM) includes electrically charging a substrate with Ar sputtering followed by crystalline deposition of a seed layer at an optimized temperature, followed by crystalline deposition of a phase change material layer at an optimized temperature. Given the teachings herein, the skilled artisan can select appropriate temperatures depending on the materials and whether amorphous or crystalline form is desired.

Figure 13:
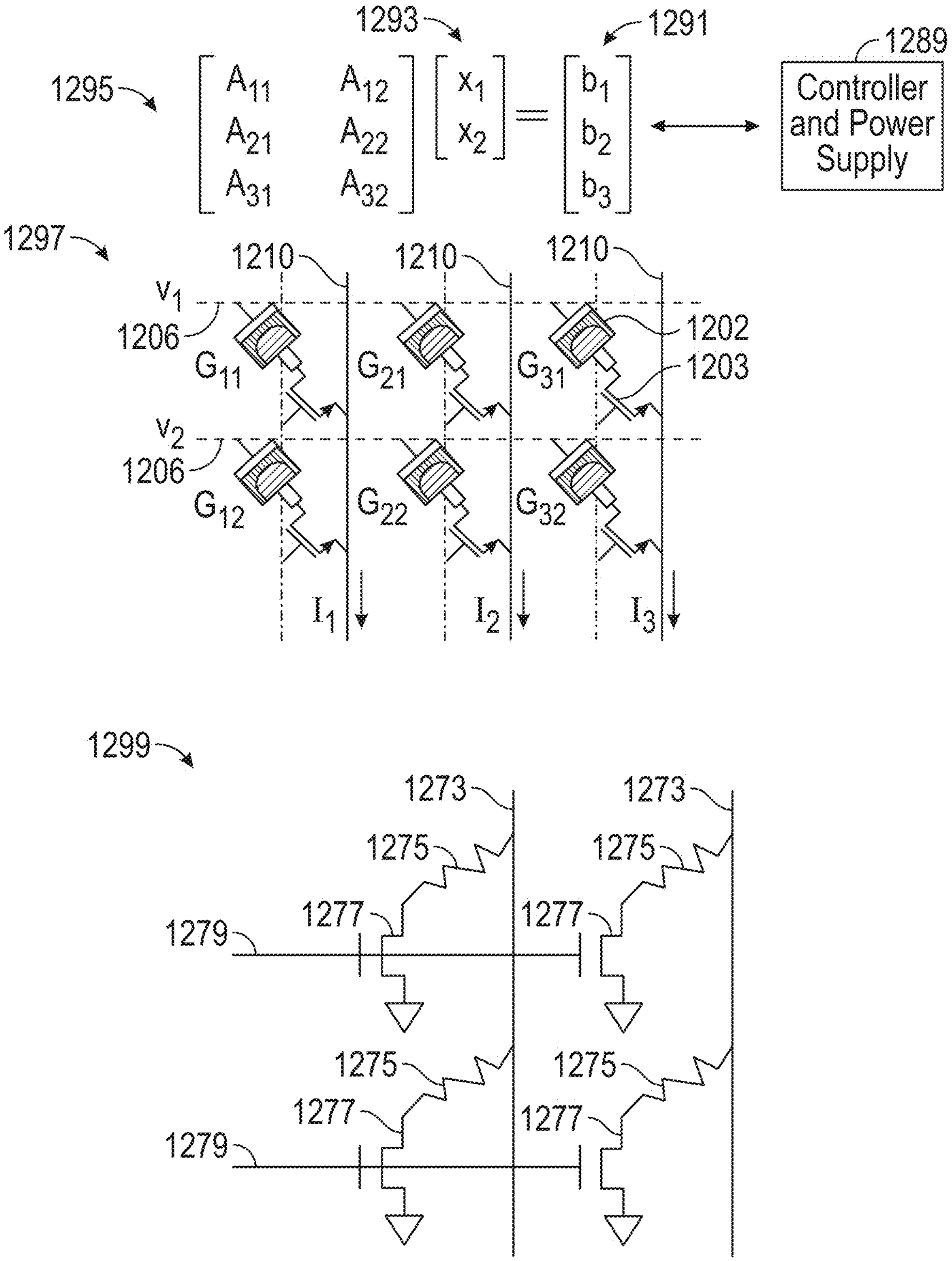
FIG. 13 shows a cross-bar array of PCM cells, according to an aspect of the invention.

Refer now to FIG. 13. View 1299 shows a phase change memory array; only a 2 by 2 array is shown but any suitable number of cells can be employed. The appropriate word line 1279 selects which bit it is desired to read or write. The word line connects to the gate of a transistor 1277. The gate of the transistor provides an electrical switching function. The drain of the transistor is connected to one terminal of the memory element 1275 (e.g. PCM according to any of the disclosed embodiments), while the other terminal of the memory element is connected to a corresponding bit line 1273. The source of the switch (transistor) is connected to ground.

There are many ways to read the bit. For example, the bit line is charged to some voltage and then kept floating, and the word line is set to high which opens the switch, allowing current to flow from the bit line to the ground through the memory element. If the memory element is in RESET phase, the bit line will remain charged, since little current will flow dure to the PCM high resistance. But if the PCM is in SET phase, then the bit line will discharge, since the PCM is at low resistance, and the voltage on the bit line will approach zero. A sensing amplifier can be used to detect the voltage on the bit line to determine if the bit read was a "0" or a "1."

To write the bit, the bit is selected by applying a voltage to the word line and then pulsing the bit line with a SET or a RESET pulse.

Note that the read operation is typically done with a low voltage to avoid an accidental writing of the bit; the skilled artisan can heuristically select a suitable voltage, given the teachings herein.

View 1297 shows a crossbar array for AI computation; the general structure of such an array, using prior-art memory cells, is known from the IBM Research Paper by Abu Sebastian, Manuel Le Gallo, Geoffrey W. Burr, Sangbum Kim, Matthew BrightSky, and Evangelos Eleftheriou, "Tutorial: Brain-inspired computing using phase-change memory devices," *Journal of Applied Physics* 124, no. 11 (2018 Sep. 21), pages 111101-1 to 111101-1. Voltage is applied on the input lines 1206, and the currents from each PCM element 1202 (e.g. PCM according to any of the disclosed embodiments) are summed in the output lines 1210. The current in each element is V(j)×G(k,j), where G is the conductance of element (k,j). Conductance is 1/R, or one over the resistance of the PCM element.

So, as a result, the output lines 1210 are the sum of the products of the input voltages time the conductance of the array elements. This multiply accumulate (MAC) is a very common operation for the computation of artificial neural networks, so a crossbar array can be used to accelerate AI computation. Note the transistors 1203 are used to prevent the read current from flowing through another bit which is in SET phase to another output line. Suppressing unwanted current flow in unselected cells is referred to as "sneak path" current.

The matrices and vectors are generally suggestive of weighting, peripheral circuitry, etc., as will be familiar to the skilled artisan.

A large array of memory devices can be implemented on a single chip. An arbitrarily large number of cells 1202 or 1275 can be employed, within the limits of the manufacturing processes and design specifications. View 1297 is an example of an analog AI application (multiplying A matrix 1295 by x vector 1293 to obtain output vector b 1291). The matrices and vectors are generally indicative of weighting, peripheral circuitry, and the like that will be familiar to the skilled artisan. A controller (e.g., known digital circuitry) and power supply 1289 are coupled to the array(s) and peripheral circuits in a known manner—crossbar arrays per se are well known; given the teachings herein, the skilled artisan can implement such an array with appropriate peripheral circuitry, controller, and power supply with inventive PCM cells as disclosed herein.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, ion milling, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method, and the structures formed thereby, are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: *Fundamentals, Practice, and Modeling* 1$^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary phase-change memory cell includes an (inner) insulating layer 301A, 601A; and a first electrode 303, 603/603L embedded in the (inner) insulating layer. An outer end of the first electrode is locally flush with an outer surface of the (inner) insulating layer (e.g., upper surface in FIG. 1, surface of facet in FIG. 6). Also included is a second electrode 309, 609, larger than the first electrode, and spaced from the first electrode. Also included are a compositionally homogenous crystalline phase change material layer 307, 307L, 607; and a highly oriented seed layer 305, 305/313, 613. A crystal structure of the homogenous phase change material layer is correlated with a crystal structure of the highly oriented seed layer. The compositionally homogenous phase change material layer and the highly oriented seed layer are located at least partially between the first and second electrodes.

The crystal structure of the PCM is correlated with the seed layer in that, if one knows the seeding layer one knows what the PCM layer will be. The PCM layer templates from the seed layer. IN one or more embodiments, there is alignment along at least one direction.

As used herein, in a compositionally homogeneous layer, the atomic concentration of the different elements which make the film are uniform throughout the film. Experimentally, this can be verified using SIMS (Secondary-ion mass spectrometry). In this method, the film is sputtered using an ion beam and the mass of the elements being sputtered are measured. This allows one to obtain a depth profile of the elemental concentrations in the film. If a film has multiple layers of different compositions, such as a prior art superlattice structure, SIMS will show a change in the composition as the film is being sputtered. A homogeneous film, on the other hand, will show a constant composition of the elements in a depth profiling.

In one or more embodiments, such as all the exemplary embodiments other than FIGS. 5 and 7, the compositionally homogenous phase change material layer and the highly oriented seed layer are of different materials.

Optionally, in any or all of the disclosed embodiments, the seed layer has an out-of-plane crystalline axis and the homogenous phase change material layer has an out-of-plane crystalline axis aligned to the out-of-plane crystalline axis of the seed layer. Refer to the depiction of the Z axis.

In one or more embodiments, such as all the exemplary embodiments other than FIGS. 5 and 7, the seed layer can optionally be selected from the group consisting of $Ti_xTe_y$ and $Sb_xTe_y$.

Optionally, in any or all of the disclosed embodiments, the homogenous phase change material layer includes van der Waals gaps.

In one or more embodiments, such as all the exemplary embodiments other than FIGS. 5 and 7, the homogenous phase change material layer and the seed layer each have a (111) crystal orientation.

Optionally, in any or all of the disclosed embodiments, the homogenous phase change material is selected from the group consisting of GST and $Sb_xTe_y$. Optionally, in such embodiments, the seed layer and the homogenous phase change material are selected from the group consisting of:

the seed layer of 0.25-5 nm $TiTe_2$ and the homogenous crystalline phase change material layer of 1-100 nm $Sb_2Te_3$;

the seed layer of 0.25-5 nm $TiTe_2$ and the homogenous crystalline phase change material layer of 1-100 nm $Ge_2Sb_2Te_5$; and the seed layer of 0.25-5 nm $Sb_2Te_3$ and the homogenous crystalline phase change material layer of 1-100 nm $Ge_2Sb_2Te_5$.

Referring, for example, to the embodiment of FIG. 1, in some instances, the seed layer 305 is generally planar and outward of the (inner) insulating layer 301A; the homogenous phase change material layer 307 is generally planar and outward of the seed layer; and the second electrode 309 is generally planar and outward of the homogenous phase change material layer.

Referring, for example, to the embodiment of FIG. 3, in some instances, the homogenous phase change material layer 307 is generally planar and outward of the (inner) insulating layer 301A; the seed layer 305 is generally planar and outward of the homogenous phase change material layer; and the second electrode 309 is generally planar and outward of the seed layer.

Referring, for example, to the embodiment of FIG. 4, in some instances, the seed layer 305 comprises a first seed layer of a non-phase change material, and further included is a second seed layer 313 of a phase change material. The first seed layer 305 is generally planar and outward of (inner) insulating layer 301A; the second seed layer 313 is generally planar and outward of the first seed layer; the homogenous phase change material layer 307 is generally planar and outward of the second seed layer; and the second electrode 309 is generally planar and outward of the homogenous phase change material layer. Optionally, in such embodiments, the first seed layer comprises 0.25-5 nm $TiTe_2$, the second seed layer comprises 1-5 nm $Sb_2Te_3$, and the homogenous phase change material layer comprises 1-100 nm $Ge_2Sb_2Te_5$.

Referring, for example, to the embodiment of FIG. 6, in some instances, the first electrode has a generally vertical portion 603 and a horizontal (lateral) projection 603L; the (inner) insulating layer 601A has a stepped region (facet 606), and the horizontal projection of the first electrode extends to a surface of the stepped region. Furthermore, the seed layer 613 is outward of the (inner) insulating layer in contact with the horizontal projection 603L of the first electrode and the stepped region. The homogenous phase change material layer 607 is outward of the seed layer; and the second electrode 609 is outward of the homogenous phase change material layer.

Referring, for example, to the embodiment of FIG. 6, in some instances, the seed layer 305 is outward of the (inner) insulating layer 301A; the homogenous phase change material layer 307 is outward of the seed layer 305; and the second electrode 309L is located at at least one side of the homogenous phase change material layer and the seed layer.

Referring, for example, to the embodiment of FIG. 6, in some instances, the homogenous phase change material layer 307L is outward of the (inner) insulating layer 301A; the second electrode 309 is located outward of the homogenous phase change material layer; and the seed layer 305L is located at a side (and preferably only a single side) of the homogenous phase change material layer.

Referring for example, to the embodiment of FIG. 12A, in some instances, the homogenous phase change material layer is outward of the (inner) insulating layer 301A; the second electrode 309 (not shown in FIG. 12A, see any of the other embodiments such as FIGS. 1 and 3) is outward of the homogenous phase change material layer; and the seed layer 305M is within the homogenous phase change material layer. Note that FIG. 12A shows the homogenous phase change material layer in amorphous form at 307A-1, 307A-2, prior to crystallization.

In any of the embodiments, the second electrode is larger than the first electrode in that the second electrode has a cross-sectional area at least 6 times that of the first electrode.

In another aspect, referring to FIG. 13, a phase-change memory array includes a plurality of horizontal lines 1206 or 1279; a plurality of vertical lines 1210 or 1273 intersecting the plurality of horizontal lines at a plurality of cell locations; and a plurality of phase-change memory cells 1202 or 1275 located at each of said plurality of cell locations. A plurality of transistors 1203 1277 are associated with each of the plurality of phase-change memory cells. Each of the phase-change memory cells can be in accordance with any of the embodiments disclosed herein. A controller 1289 can optionally be provided to control reading, writing, MAC calculations, etc.

In still another aspect, an exemplary method of operation includes providing an array 1299, and using the controller to cause a first subset of the cells to store logical ones and a second subset of the cells to store logical zeroes; and reading out the stored logical ones and zeroes. Alternatively, an exemplary method of operation includes providing an array 1297, and using the controller to cause MAC calculations to be performed.

In a further aspect, an exemplary method of forming a phase-change memory cell includes providing a starting structure comprising a substrate, an insulating layer outward of the substrate, and a first electrode embedded in the insulating layer. An outer end of the first electrode is locally flush with an outer surface of the insulating layer. Further steps include depositing a highly oriented crystalline seed layer on an outer surface of the insulating layer and the outer end of the first electrode; epitaxially growing a compositionally homogenous crystalline phase change material layer on the highly oriented crystalline seed layer; and depositing a top electrode material on the compositionally homogenous crystalline phase change material layer. In one or more embodiments, for example, deposit a thin (0.25-5 nm) crystalline seed layer with crystalline z-axis orientation perpendicular to the substrate, deposit a crystalline phase change material layer with oriented z-axis aligned to the seed layer z-axis. Electrically charging the substrate with Ar sputtering before crystalline deposition of seed layer can be carried out in one or more embodiments.

In a still further aspect, another exemplary method of forming a phase-change memory cell includes providing a starting structure comprising a substrate, an insulating layer outward of the substrate, and a first electrode embedded in the insulating layer. An outer end of the first electrode is locally flush with an outer surface of the insulating layer. Further steps include depositing an amorphous phase change material layer on an outer surface of the insulating layer and the outer end of the first electrode (e.g., at room temperature); depositing a highly oriented crystalline seed layer on an outer surface of the amorphous phase change material layer at a temperature below a crystallization temperature of the first amorphous phase change material layer, to produce a resultant structure; and annealing the resultant structure at a temperature above the crystallization temperature of the first amorphous phase change material layer to induce a solid phase crystallization of the amorphous phase change material layer by templating from the seeding layer. Optionally, a sputtering clean step may be used after amorphous PCM deposition, to clean the oxide that may form during temperature ramp-up to the deposition temperature of the seeding layer. Furthermore, this sputtering clean may deposit charge into the PCM layer surface which may be helpful to orient the seeding layer.

In an even further aspect, another exemplary method of forming a phase-change memory cell includes providing a starting structure comprising a substrate, an insulating layer outward of the substrate, and a first electrode embedded in the insulating layer. An outer end of the first electrode is locally flush with an outer surface of the insulating layer and the insulating layer is amorphous. Further steps include preparing an outer surface of the amorphous insulating layer to cause orientation of a subsequently epitaxially grown a compositionally homogenous crystalline phase change material layer; epitaxially growing the compositionally homogenous crystalline phase change material layer on the prepared outer surface of the amorphous insulating layer at a temperature such that compositionally homogenous crystalline phase change layer grows in a crystalline manner; and depositing a top electrode material on the compositionally homogenous crystalline phase change material layer. Thus, in one or more such "no seed layer" embodiments: (i) prepare amorphous surface; and (ii) deposit PCM at a temperature such that it grows in a crystalline manner (e.g., 150 C to 250 C). Preparing the amorphous surface may include, for example, depositing charge in the surface of the amorphous layer and choosing a PCM material that organizes upon deposition in a highly oriented configuration. One example of such a PCM material is $Sb_2Te_3$.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from phase change memory cells with crystalline structure aligned to seed layer in phase change memory arrays and the like.

An integrated circuit in accordance with aspects of the present inventions can be employed in essentially any application and/or electronic system where phase change memory cells with crystalline structure aligned to seed layer in phase change memory arrays and the like would be beneficial. Given the teachings of the present disclosure provided herein, one of ordinary skill in the art will be able to contemplate other implementations and applications of embodiments disclosed herein.

Figure 14:
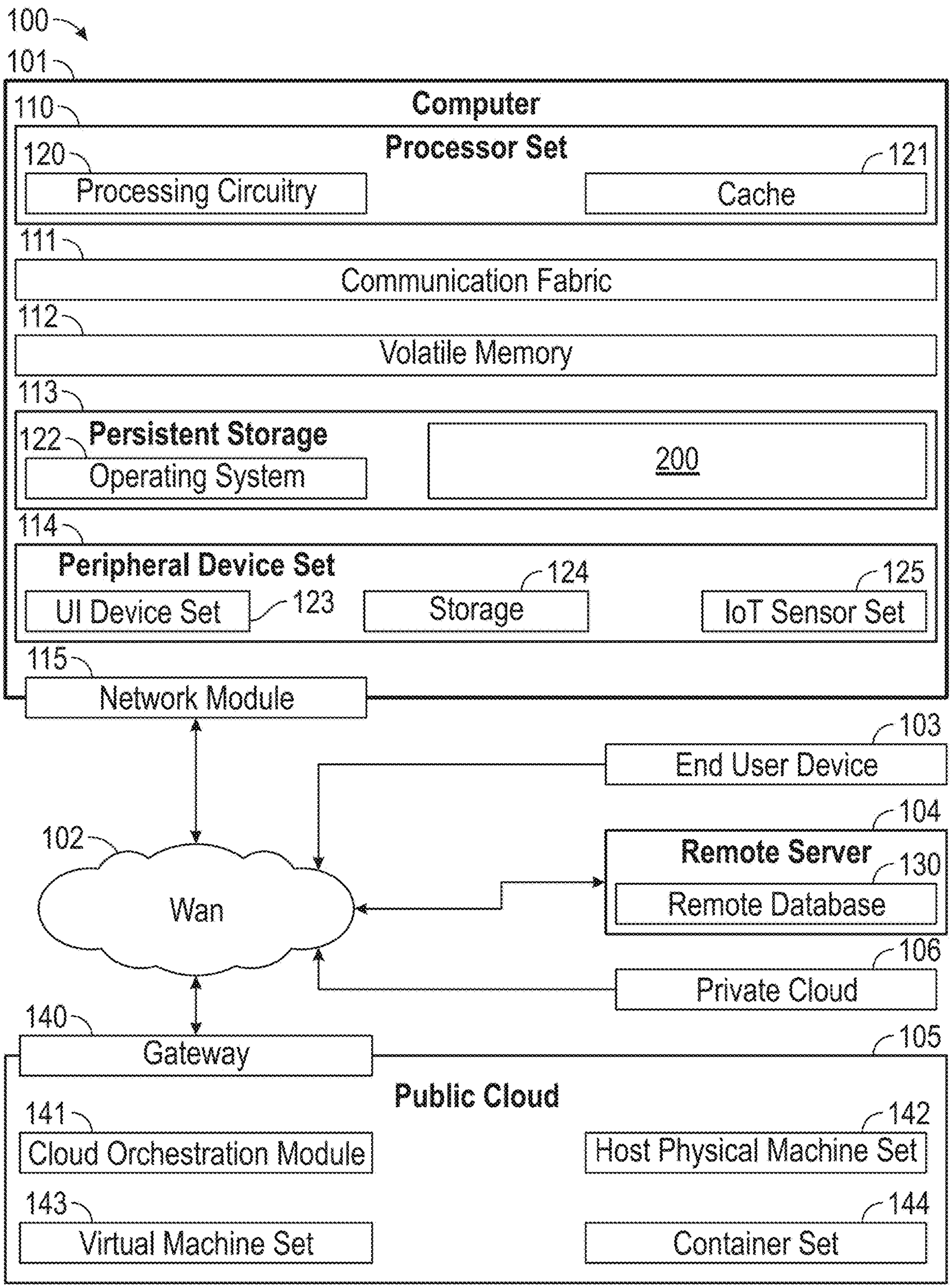
FIG. 14 depicts a computing environment according to an embodiment of the present invention (e.g., for implementing a design process such as that of FIG. 15)
Figure 15:
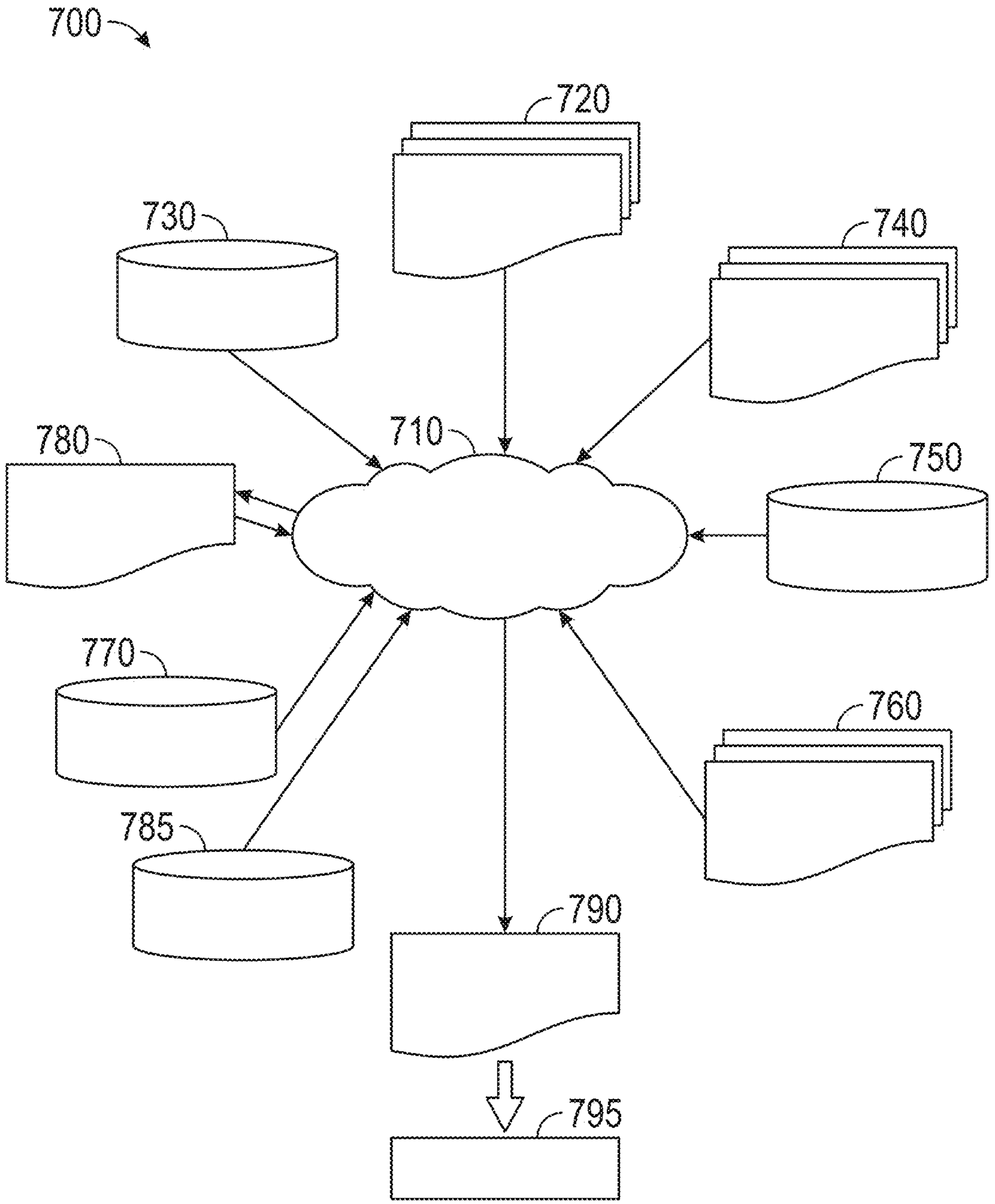
FIG. 15 is a flow diagram of a design process used in semiconductor design, manufacture, and/or test.

Reference should now be had to FIG. 14, which depicts a computing environment according to an embodiment of the present invention (e.g., for implementing a design process such as that of FIG. 15)

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as a system 200 for semiconductor design and/or control of semiconductor fabrication (see FIG. 15). In addition to block 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 14. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Exemplary Design Process Used in Semiconductor Design, Manufacture, and/or Test

One or more embodiments make use of computer-aided semiconductor integrated circuit design simulation, test, layout, and/or manufacture. In this regard, FIG. 15 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., lib files). Design structure 790 may then proceed to a stage 795 where, for example, design structure 790: proceeds to tape-out, is released to manufacturing, is released to a mask house, is sent to another design house, is sent back to the customer, etc.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A phase-change memory cell, comprising:
- an insulating layer;
- a first electrode embedded in the insulating layer, wherein an outer end of the first electrode is locally flush with an outer surface of the insulating layer;
- a second electrode, larger than the first electrode, and spaced from the first electrode;
- a compositionally homogenous crystalline phase change material layer; and
- a highly oriented seed layer, wherein a crystal structure of the homogenous phase change material layer is correlated with a crystal structure of the highly oriented seed layer;
- wherein the compositionally homogenous phase change material layer and the highly oriented seed layer are located at least partially between the first and second electrodes,
- wherein the compositionally homogenous phase change material layer and the highly oriented seed layer are of different materials, and
- wherein the highly oriented seed layer has an out-of-plane crystalline axis and the homogenous phase change material layer has an out-of-plane crystalline axis aligned to the out-of-plane crystalline axis of the highly oriented seed layer.

2. The phase-change memory cell of claim 1, wherein the highly oriented seed layer is selected from the group consisting of $Ti_xTe_y$ and $Sb_xTe_y$.

3. The phase-change memory cell of claim 1, wherein the homogenous phase change material layer includes van der Waals gaps.

4. The phase-change memory cell of claim 1, wherein the homogenous phase change material layer and the highly oriented seed layer each have a (111) crystal orientation.

5. The phase-change memory cell of claim 1, wherein the homogenous phase change material is selected from the group consisting of GST and $Sb_xTe_y$.

6. The phase-change memory cell of claim 5, wherein the highly oriented seed layer and the homogenous phase change material are selected from the group consisting of:
- the highly oriented seed layer of 0.25-5 nm $TiTe_2$ and the homogenous crystalline phase change material layer of 1-100 nm $Sb_2Te_3$;
- the highly oriented seed layer of 0.25-5 nm $TiTe_2$ and the homogenous crystalline phase change material layer of 1-100 nm $Ge_2Sb_2Te_5$; and
- the highly oriented seed layer of 0.25-5 nm $Sb_2Te_3$ and the homogenous crystalline phase change material layer of 1-100 nm $Ge_2Sb_2Te_5$.

7. The phase-change memory cell of claim 1, wherein:
the highly oriented seed layer is generally planar and outward of the insulating layer;
the homogenous phase change material layer is generally planar and outward of the highly oriented seed layer; and
the second electrode is generally planar and outward of the homogenous phase change material layer.

8. The phase-change memory cell of claim 1, wherein:
the homogenous phase change material layer is generally planar and outward of the insulating layer;
the highly oriented seed layer is generally planar and outward of the homogenous phase change material layer; and
the second electrode is generally planar and outward of the highly oriented seed layer.

9. The phase-change memory cell of claim 1, wherein the highly oriented seed layer comprises a first seed layer of a non-phase change material, further comprising a second seed layer of a phase change material, wherein:
the first seed layer is generally planar and outward of the insulating layer;
the second seed layer is generally planar and outward of the first seed layer;
the homogenous phase change material layer is generally planar and outward of the second seed layer; and
the second electrode is generally planar and outward of the homogenous phase change material layer.

10. The phase-change memory cell of claim 9, wherein the first seed layer comprises 0.25-5 nm $TiTe_2$, the second seed layer comprises 1-5 nm $Sb_2Te_3$, and the homogenous phase change material layer comprises 1-100 nm $Ge_2Sb_2Te_5$.

11. The phase-change memory cell of claim 1, wherein:
the first electrode has a generally vertical portion and a horizontal projection;
the insulating layer has a stepped region, the horizontal projection of the first electrode extending to a surface of the stepped region;
the highly oriented seed layer is outward of the insulating layer in contact with the horizontal projection of the first electrode and the stepped region;
the homogenous phase change material layer is outward of the highly oriented seed layer; and
the second electrode is outward of the homogenous phase change material layer.

12. The phase-change memory cell of claim 1, wherein:
the highly oriented seed layer is outward of the insulating layer;
the homogenous phase change material layer is outward of the highly oriented seed layer; and
the second electrode is located at at least one side of the homogenous phase change material layer and the highly oriented seed layer.

13. The phase-change memory cell of claim 1, wherein:
the homogenous phase change material layer is outward of the insulating layer;
the second electrode is located outward of the homogenous phase change material layer; and
the highly oriented seed layer is located at a side of the homogenous phase change material layer.

14. The phase-change memory cell of claim 1, wherein:
the homogenous phase change material layer is outward of the substrate insulating layer;
the second electrode is outward of the homogenous phase change material layer; and
the highly oriented seed layer is within the homogenous phase change material layer.

15. The phase-change memory cell of claim 1, wherein the second electrode is larger than the first electrode in that the second electrode has a cross-sectional area at least 6 times that of the first electrode.

16. A phase-change memory array, comprising:
a plurality of horizontal lines;
a plurality of vertical lines intersecting the plurality of horizontal lines at a plurality of cell locations;
a plurality of phase-change memory cells located at each of said plurality of cell locations; and
a plurality of transistors associated with each of the plurality of phase-change memory cells;
wherein each of the phase-change memory cells comprises:
an insulating layer;
a first electrode embedded in the insulating layer, wherein an outer end of the first electrode is locally flush with an outer surface of the insulating layer;
a second electrode, larger than the first electrode, and spaced from the first electrode;
a compositionally homogenous crystalline phase change material layer; and
a highly oriented seed layer, wherein a crystal structure of the homogenous phase change material layer is correlated with a crystal structure of the highly oriented seed layer;
wherein the compositionally homogenous phase change material layer and the highly oriented seed layer are located at least partially between the first and second electrodes,
wherein the compositionally homogenous phase change material layer and the highly oriented seed layer are of different materials, and
wherein the highly oriented seed layer has an out-of-plane crystalline axis and the homogenous phase change material layer has an out-of-plane crystalline axis aligned to the out-of-plane crystalline axis of the highly oriented seed layer.

17. The phase-change memory array of claim 16, wherein the homogenous phase change material layer includes van der Waals gaps.

18. The phase-change memory array of claim 17, wherein the homogenous phase change material layer and the highly oriented seed layer each have a (111) crystal orientation.

19. A phase-change memory cell, comprising:
an insulating layer;
a first electrode embedded in the insulating layer;
a second electrode spaced from the first electrode;
a compositionally homogenous crystalline phase change material layer; and
a seed layer, wherein a crystal structure of the homogenous phase change material layer is correlated with a crystal structure of the seed layer;
wherein the compositionally homogenous phase change material layer and the seed layer are located at least partially between the first and second electrodes,
wherein the compositionally homogenous phase change material layer and the seed layer are of different materials, and
wherein the seed layer has an out-of-plane crystalline axis and the homogenous phase change material layer has an out-of-plane crystalline axis aligned to the out-of-plane crystalline axis of the seed layer.

20. The phase-change memory cell of claim 19, wherein the seed layer comprises $Ti_xTe_y$ or $Sb_xTe_y$.

21. The phase-change memory cell of claim 19, wherein the homogenous phase change material layer includes van der Waals gaps.

22. The phase-change memory cell of claim 19, wherein the homogenous phase change material layer and the seed layer each have a (111) crystal orientation.

23. The phase-change memory cell of claim 19, wherein the homogenous phase change material comprises GST or $Sb_xTe_y$.

24. The phase-change memory cell of claim 19, wherein:
- the seed layer is generally planar and outward of the insulating layer;
- the homogenous phase change material layer is generally planar and outward of the seed layer; and
- the second electrode is generally planar and outward of the homogenous phase change material layer.

25. The phase-change memory cell of claim 19, wherein:
- the homogenous phase change material layer is generally planar and outward of the insulating layer;
- the seed layer is generally planar and outward of the homogenous phase change material layer; and
- the second electrode is generally planar and outward of the seed layer.

* * * * *